United States Patent
Shimizu et al.

(10) Patent No.: US 11,472,621 B2
(45) Date of Patent: Oct. 18, 2022

(54) REEL FOR TAPING ELECTRONIC COMPONENT PACKAGE

(71) Applicant: Murata Manufacturing Co., Ltd., Nagaokakyo (JP)

(72) Inventors: Yasuhiro Shimizu, Nagaokakyo (JP); Kiyoyuki Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 138 days.

(21) Appl. No.: 17/037,853

(22) Filed: Sep. 30, 2020

(65) Prior Publication Data

US 2021/0107715 A1    Apr. 15, 2021

(30) Foreign Application Priority Data

Oct. 11, 2019    (JP) .............................. JP2019-187895

(51) Int. Cl.
| | | |
|---|---|---|
| *B65H 75/22* | (2006.01) | |
| *B65D 75/36* | (2006.01) | |
| *B65H 75/14* | (2006.01) | |

(52) U.S. Cl.
CPC .......... *B65D 75/367* (2013.01); *B65H 75/22* (2013.01); *B65H 75/14* (2013.01)

(58) Field of Classification Search
CPC ...... B65H 75/14; B65H 75/22; B65D 75/367; B65D 73/02
See application file for complete search history.

(56) References Cited

U.S. PATENT DOCUMENTS

| | | | | |
|---|---|---|---|---|
| 3,785,584 | A | * 1/1974 | Crellin, Jr. ............. | B65H 75/14 403/381 |
| 4,570,869 | A |   2/1986 | Tsuji | |
| 6,089,500 | A | * 7/2000 | Hafner ................... | B65H 75/22 242/608.5 |
| 2007/0176044 | A1 | * 8/2007 | Sogabe ................ | G11B 23/037 242/608.8 |
| 2008/0230648 | A1 | * 9/2008 | Hafner ................... | B65H 75/22 242/613 |
| 2015/0329280 | A1 |   11/2015 | Shimizu et al. | |

FOREIGN PATENT DOCUMENTS

| | | |
|---|---|---|
| CN | 105083610 A | 11/2015 |
| JP | H02124979 U | 10/1990 |
| JP | 2004-359280 A | 12/2004 |
| JP | 2006089258 A | 4/2006 |

(Continued)

OTHER PUBLICATIONS

Official Communication issued in corresponding Chinese Patent Application No. 202011045061.1, dated Mar. 2, 2022.

(Continued)

*Primary Examiner* — Sang K Kim
(74) *Attorney, Agent, or Firm* — Keating & Bennett, LLP

(57) ABSTRACT

A reel for a taping electronic component package with a tape including multiple recesses and electronic components housed in the respective recesses includes a core around which the taping electronic component package is to be wound, a pair of flanges that are located at respective ends of the core and that face each other across the core in an axial direction, and a separating portion that irreversibly separates the flanges.

19 Claims, 10 Drawing Sheets

(56) References Cited

FOREIGN PATENT DOCUMENTS

| JP | 2007-115898 A | 5/2007 |
|----|---------------|--------|
| JP | 2008-001460 A | 1/2008 |
| JP | 2013-035646 A | 2/2013 |
| JP | 2015-103775 A | 6/2015 |
| JP | 2015231911 A | 12/2015 |
| JP | 2019064761 A | 4/2019 |

OTHER PUBLICATIONS

Official Communication issued in corresponding Korean Patent Application No. 10-2020-0120282, dated Nov. 17, 2021.
Office Action in JP2019187895, dated Jun. 28, 2022, 3 pages.

* cited by examiner

REEL FOR TAPING ELECTRONIC COMPONENT PACKAGE

CROSS REFERENCE TO RELATED APPLICATIONS

This application claims the benefit of priority to Japanese Patent Application No. 2019-187895 filed on Oct. 11, 2019. The entire contents of this application are hereby incorporated herein by reference.

BACKGROUND OF THE INVENTION

1. Field of the Invention

The present invention relates to a reel for a taping electronic component package.

2. Description of the Related Art

Electronic components are mounted on substrates commonly with a component mounter such as one disclosed in JP 2007-115898 A. A component mounter draws a carrier tape, also called a taping electronic component package, from a reel, takes an electronic component out of the carrier tape, and mounts the electronic component on a predetermined position of a substrate.

The carrier tape, as illustrated in FIG. 14 of JP 2007-115898 A, is composed of a tape including multiple recesses, electronic components housed in the respective recesses, and a cover film covering the recesses.

Commonly, a single component mounter mounts multiple types of electronic components on a substrate. Thus, the component mounter is provided with multiple carrier tapes. For example, FIG. 13 of JP 2007-115898 A shows a component feeder including multiple tape feeders that are arranged in the axial direction parallel to the width direction of the tapes, carrier tapes that are fed by the respective tape feeders and that provide respective electronic components, and reels around which the respective carrier tapes are wound.

Each reel for a carrier tape, as disclosed in JP 2015-103775 A, includes a shaft, also called a core, and a pair of flanges each having a greater outer shape than the shaft and provided at respective ends of the shaft.

The widths of the reels for carrier tapes are specified by standards and, in some cases, the widths of reels may be greater than the widths of the tape feeders. In this case, the positions of the reels need to be staggered up and down or forward and backward to make the feeding direction of each tape feeder parallel to the longitudinal direction of each tape in attaching the carrier tapes to the respective tape feeders provided in the axial direction. Thus, attachment of carrier tapes to tape feeders using conventional reels involves a problem of installation space in mounting an increased number of electronic components.

SUMMARY OF THE INVENTION

Preferred embodiments of the present invention provide reels for a taping electronic component package that are each able to attach a taping electronic component package to a tape feeder in a small space.

A reel for a taping electronic component package according to a preferred embodiment of the present invention includes a core around which the taping electronic component package is to be wound, a pair of flanges that are located at respective ends of the core and that face each other across the core in an axial direction, and a separating portion that provides irreversible separation of the flanges. The taping electronic component package includes a tape including multiple recesses and electronic components housed in the respective recesses.

Preferred embodiments of the present invention provide reels for a taping electronic component package that are each able to attach a taping electronic component package to a tape feeder in a small space.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, reels for a taping electronic component package according to preferred embodiments of the present invention is described.

The present invention is not limited to the following preferred embodiments, and may be suitably modified without departing from the gist of the present invention. Combinations of two or more preferred features described in the following preferred embodiments are also within the scope of the present invention.

Hereinafter, the reels for a taping electronic component package according to the respective preferred embodiments are each simply referred to as the "reel for a taping electronic component package" when no distinction is made therebetween. The reel for a taping electronic component package is also simply referred to as a reel.

Figure 1:
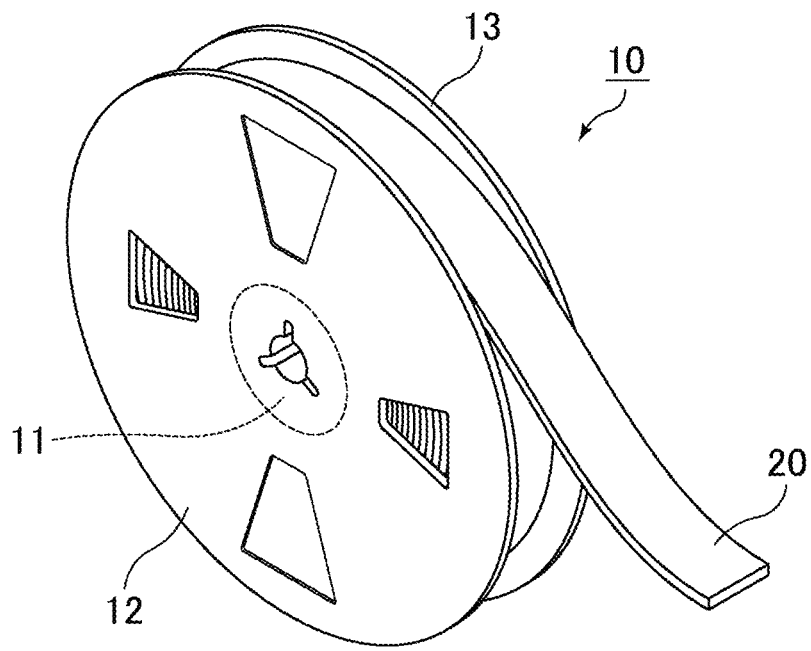
FIG. 1 is a perspective view of an example of the reel for a taping electronic component package according to a preferred embodiment of the present invention.

FIG. 1 is a perspective view of an example of a reel for a taping electronic component package according to a preferred embodiment of the present invention. FIG. 1 shows a state of the reel for a taping electronic component package around which a taping electronic component package is wound.

A reel 10 for a taping electronic component package shown in FIG. 1 includes a core 11, a first flange 12, and a second flange 13. A taping electronic component package 20 is wound around the core 11.

Figure 2:
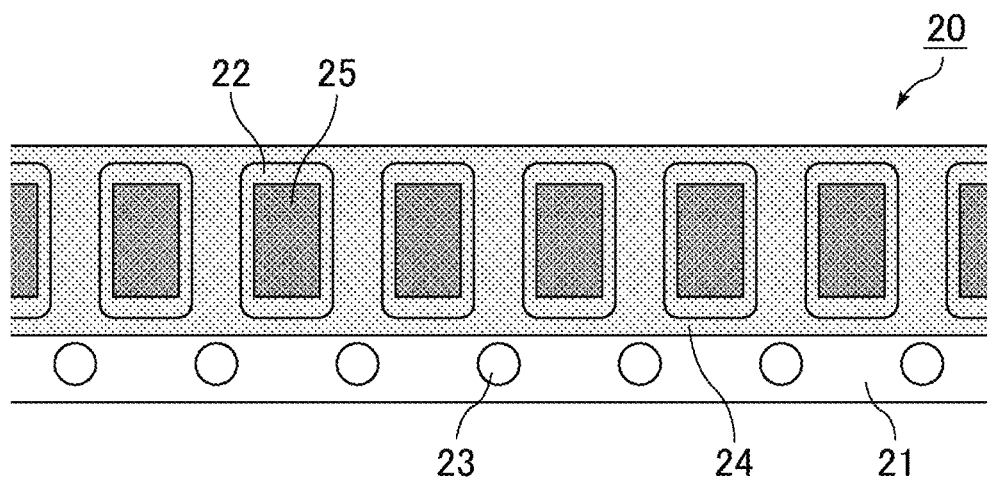
FIG. 2 is a plan view of an example of the taping electronic component package.
Figure 3:
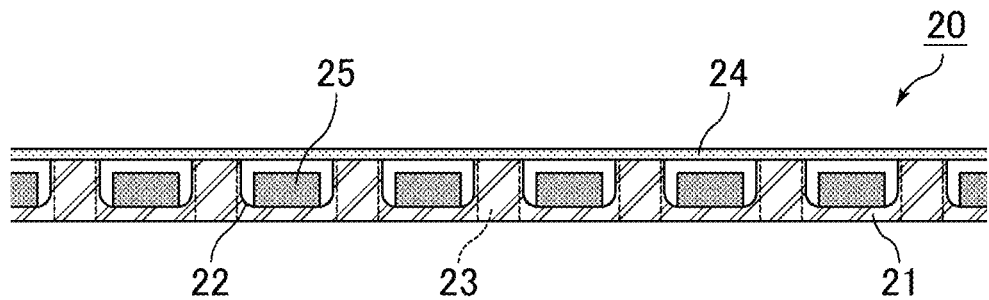
FIG. 3 is a cross-sectional view of the example of the taping electronic component package.

FIG. 2 is a plan view of an example of the taping electronic component package. FIG. 3 is a cross-sectional view of the example of the taping electronic component package.

As shown in FIG. 2 and FIG. 3, the taping electronic component package 20 includes a long tape 21. The tape 21 includes multiple recesses 22 at predetermined intervals along the longitudinal direction of the tape 21. The tape 21 also includes multiple sprocket holes 23 at predetermined intervals in parallel or substantially in parallel with the recesses 22. The recesses 22 are covered with a cover film 24.

Each recess 22 houses an electronic component 25. Examples of the electronic component 25 include capacitors, for example, multilayer ceramic capacitors, resistors, inductors, thermistors, and piezoelectric devices.

The core of the reel for a taping electronic component package may have a cylindrical or substantially cylindrical outer shape, for example. As shown in FIG. 1, the core may include a through hole.

The first flange and the second flange of the reel for a taping electronic component package are located at the respective ends of the core. The cases where the first flange and the second flange are located at the respective ends of the core include not only the case where the first flange and the second flange are on the respective end surfaces of the core but also the case where they are closer to the central portion of the core than the respective end surfaces.

The first flange and the second flange of the reel for a taping electronic component package define a pair of flanges and face each other across the core in the axial direction. The axial direction herein refers to the direction parallel or substantially parallel to the width direction of the tape defining the taping electronic component package. The first flange and the second flange each have an outer shape larger than the outer shape of the core, and may have an outer shape in a disc shape, for example.

The first flange and the second flange of the reel for a taping electronic component package are each preferably formed from a resin, for example. Examples of the resin of the first flange and the second flange include polystyrene, polyester, acrylonitrile, butadiene, and styrene copolymers. The resin of the first flange may be the same as or different from the resin of the second flange.

The first flange of the reel for a taping electronic component package is preferably joined to a corresponding end of the core or provided monolithically with the core, for example. Similarly, the second flange is preferably joined to a corresponding end of the core or provided monolithically with the core, for example. Accordingly, the core is preferably formed from a resin, for example. Examples of the resin of the core include polystyrene, polyester, acrylonitrile, butadiene, and styrene copolymers. In the case where the first flange or the second flange is joined to a corresponding end of the core, the resin of the core may be the same as or different from the resin of the first flange or the second flange.

The reel for a taping electronic component package includes a separating portion that provides irreversible separation of the flanges. Accordingly, the reel is able to be detached from a taping electronic component package after the taping electronic component package wound around the reel is attached to a tape feeder. Thus, the taping electronic component package is able to be attached to a tape feeder in a small space and, accordingly, an increased number of electronic components are able to be mounted. The "irreversible" relating to the separating portion herein does not mean that the flanges are retained by mechanical assembly after separation and they are able to define and function as a reel or be chemically retained by, for example, fixing with adhesive.

The taping electronic component package detached from the reel for a taping electronic component package is preferably attached to a tape feeder with its wound state being retained, for example. This state may be provided by any method.

The following preferred embodiments of the present invention are examples, and features of different preferred embodiments can be partially exchanged or combined with each other. In the second preferred embodiment of the present invention and subsequent preferred embodiments of the present invention, a description of features common to the first preferred embodiment is omitted, and only different points are described. In particular, similar advantageous effects by similar features are not described in each preferred embodiment.

First Preferred Embodiment

In a first preferred embodiment of the present invention, the separating portion of the reel for a taping electronic component package is located inside the core and disassembling the core in the axial direction or substantially in the axial direction provides separation of the flanges.

Figure 4A:
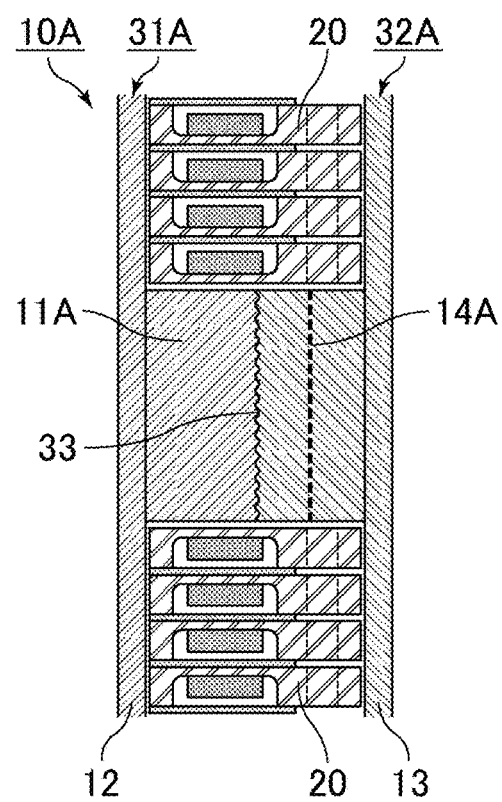
FIGS. 4A and 4B are each an enlarged cross-sectional view of an example of a reel for a taping electronic component package according to a first preferred embodiment of the present invention.
Figure 4B:
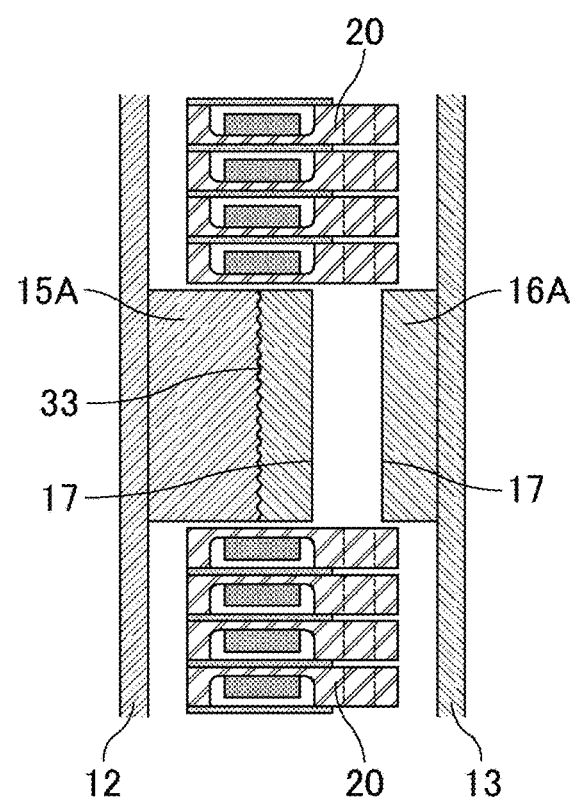

FIGS. 4A and 4B are each an enlarged cross-sectional view of an example of the reel for a taping electronic component package according to the first preferred embodiment of the present invention.

A reel 10A for a taping electronic component package shown in FIG. 4A includes a separating portion 14A inside a core 11A. The separating portion 14A may be defined by perforations, for example. As shown in FIG. 4B, disassembling the core 11A in the axial direction or substantially in the axial direction into a first core piece 15A and a second core piece 16A provides separation of the first flange 12 and the second flange 13. In the example shown in FIG. 4B, the core 11A is disassembled with disassembly surfaces 17 being perpendicular or substantially perpendicular to the axial direction.

As shown in FIG. 4A, the reel 10A for a taping electronic component package is preferably defined by a joint between a first reel half 31A including the first flange 12 and a second reel half 32A including the second flange 13, for example. Accordingly, the separating portion 14A is located at a position different from a joint surface 33 between the first reel half 31A and the second reel half 32A.

Figure 5A:
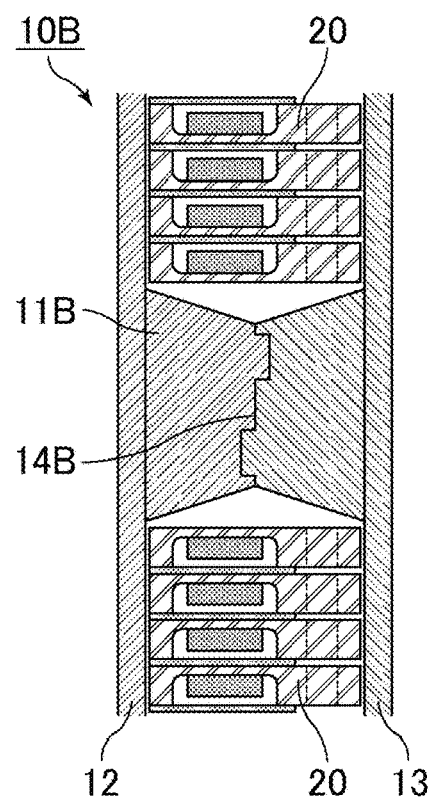
FIGS. 5A and 5B are each an enlarged cross-sectional view of another example of a reel for a taping electronic component package according to the first preferred embodiment of the present invention.
Figure 5B:
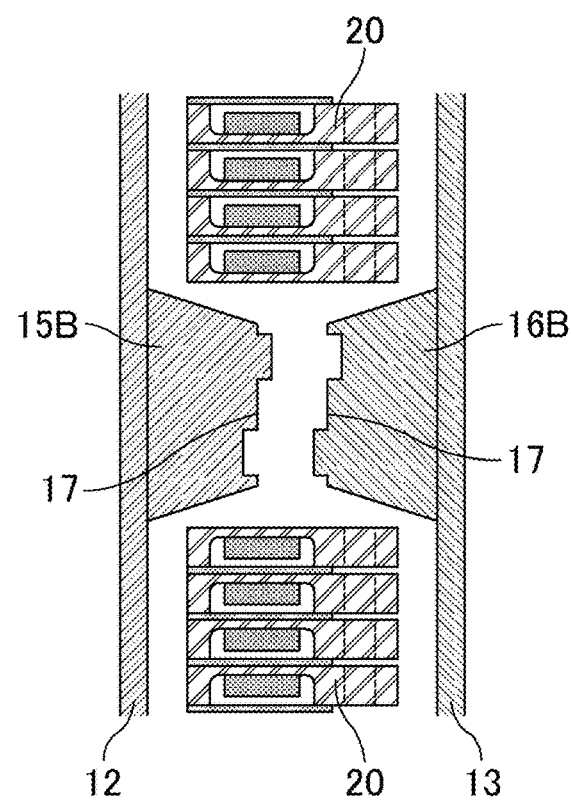

FIGS. 5A and 5B are each an enlarged cross-sectional view of another example of the reel for a taping electronic component package according to the first preferred embodiment of the present invention.

A reel 10B for a taping electronic component package shown in FIG. 5A includes a separating portion 14B inside a core 11B. The separating portion 14B is defined by a snap-fit. As shown in FIG. 5B, disassembling the core 11B in the axial direction or substantially in the axial direction into a first core piece 15B and a second core piece 16B provides separation of the first flange 12 and the second flange 13.

As shown in FIG. 4A and FIG. 5A, the separating portion of the reel for a taping electronic component package according to the first preferred embodiment of the present invention may be defined by either perforations or a snap-fit. Snap-fit separation applies a considerable stress on the flanges. Accordingly, reassembly of the parts may be difficult, resulting in irreversible separation. The snap-fit herein includes a combination of protrusions and recesses that fit the protrusions (see FIG. 5A). The snap-fit by combination of protrusions and recesses as shown in FIG. 5A may be fixed according to local fitting of the protrusions and recesses by ultrasonic welding.

Figure 6A:
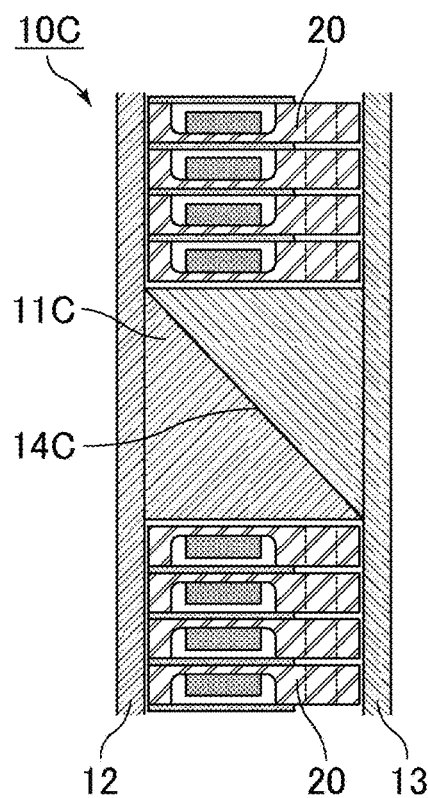
FIGS. 6A and 6B are each an enlarged cross-sectional view of another example of a reel for a taping electronic component package according to the first preferred embodiment of the present invention.
Figure 6B:
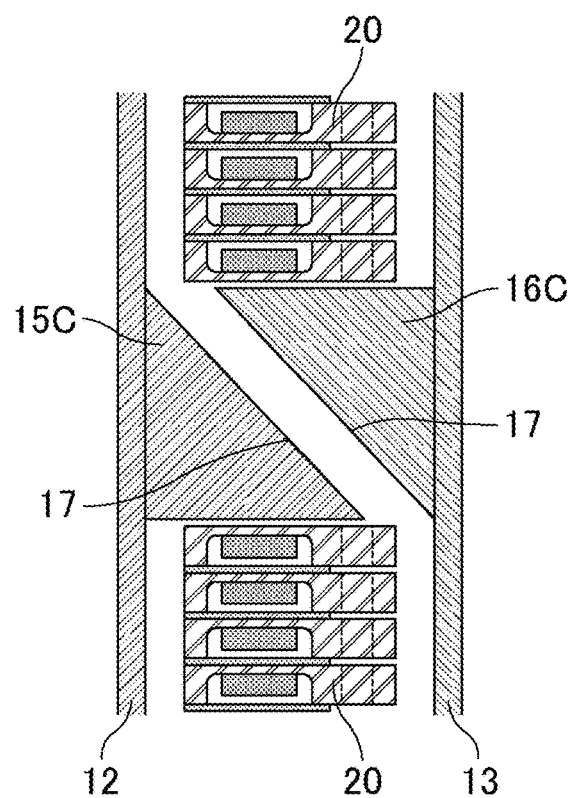

FIGS. 6A and 6B are each an enlarged cross-sectional view of another example of the reel for a taping electronic component package according to the first preferred embodiment of the present invention.

A reel 10C for a taping electronic component package shown in FIG. 6A includes a separating portion 14C inside a core 11C. The separating portion 14C may be defined by perforations, for example. As shown in FIG. 6B, disassembling the core 11C in the axial direction or substantially in the axial direction into a first core piece 15C and a second core piece 16C provides separation of the first flange 12 and the second flange 13. In the example shown in FIG. 6B, the core 11C is disassembled with the disassembly surfaces 17 being tilted relative to the axial direction.

As shown in FIG. 6B, the core of the reel for a taping electronic component package according to the first preferred embodiment of the present invention may be disassembled with the disassembly surfaces being tilted relative to the axial direction. Accordingly, the disassembled core piece has a reduced outer diameter and the reel for a taping electronic component package is thus easily extracted from the taping electronic component package.

Figure 7A:
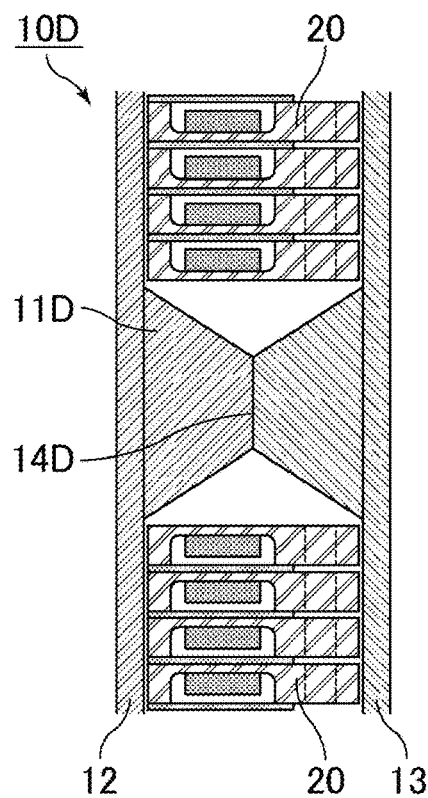
FIGS. 7A and 7B are each an enlarged cross-sectional view of another example of a reel for a taping electronic component package according to the first preferred embodiment of the present invention.
Figure 7B:
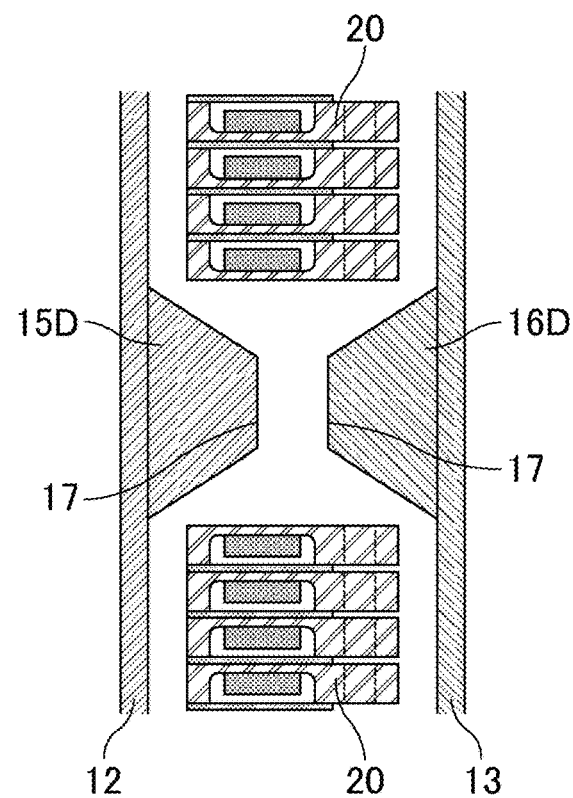

FIGS. 7A and 7B are each an enlarged cross-sectional view of another example of the reel for a taping electronic component package according to the first preferred embodiment of the present invention.

A reel 10D for a taping electronic component package shown in FIG. 7A includes a separating portion 14D inside a core 11D. The separating portion 14D may be defined by perforations, for example. As shown in FIG. 7B, disassembling the core 11D in the axial direction or substantially in the axial direction into a first core piece 15D and a second core piece 16D provides separation of the first flange 12 and the second flange 13. In the example shown in FIG. 7B, the core 11D is disassembled with the disassembly surfaces 17 being perpendicular or substantially perpendicular to the axial direction.

The side surface of the core 11D is tilted relative to the axial direction. Accordingly, a smaller contact area with the taping electronic component package 20 is provided, and thus a reduced friction between the core 11D and the taping electronic component package 20 is provided. Accordingly, the reel 10D for a taping electronic component package is able to be easily extracted from the taping electronic component package 20.

The reel 10C or 10D for a taping electronic component package may be defined by a joint between the first reel half including the first flange 12 and the second reel half including the second flange 13. Accordingly, the separating portion 14C or 14D is located at a position different from the joint surface between the first reel half and the second reel half.

The core of the reel for a taping electronic component package according to the first preferred embodiment of the present invention preferably includes a friction-reducing portion that reduces friction with the taping electronic component package, for example. Accordingly, the reel for a taping electronic component package is able to be easily extracted from the taping electronic component package.

Figure 10A:
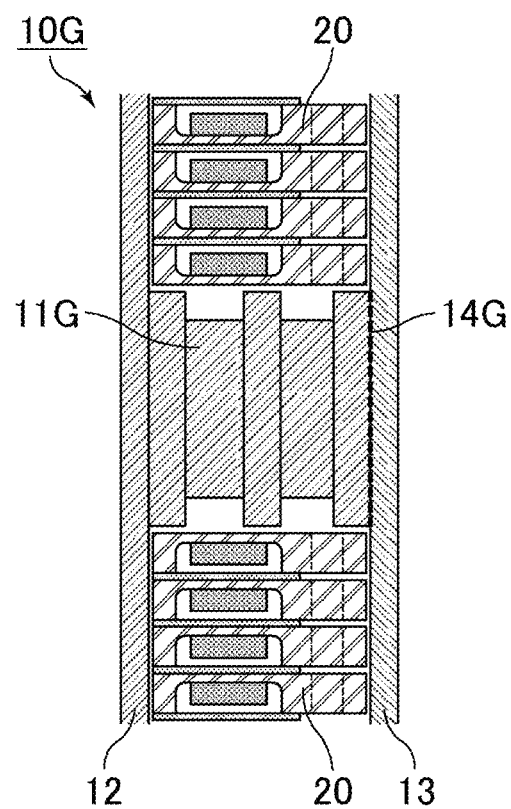
FIGS. 10A and 10B are each an enlarged cross-sectional view of another example of a reel for a taping electronic component package according to the second preferred embodiment of the present invention.
Figure 11:
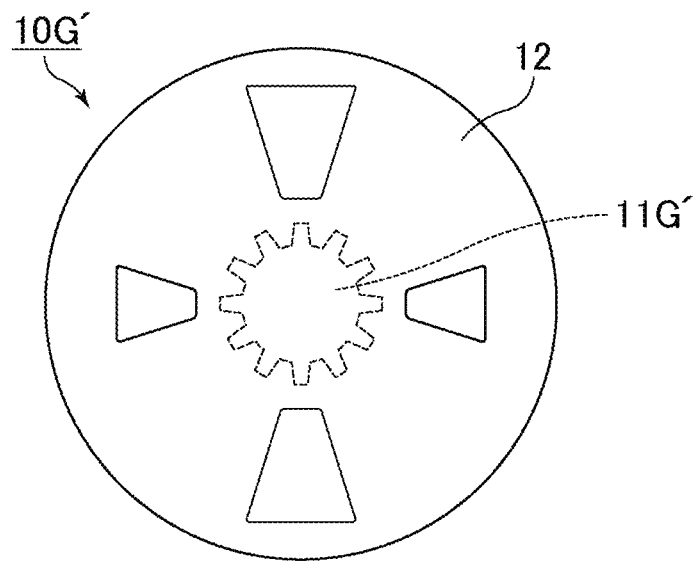
FIG. 11 is a front view of a modified example of the reel for a taping electronic component package shown in FIG. 10A.
Figure 13:
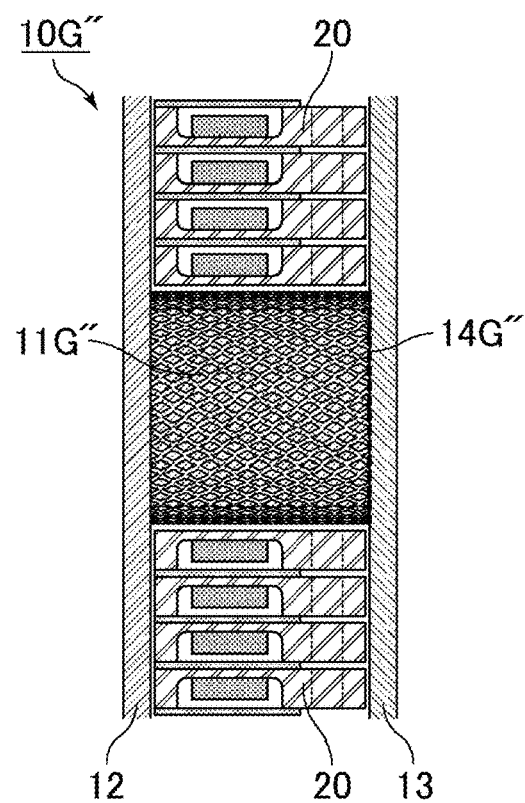
FIG. 13 is an enlarged cross-sectional view of another modified example of the reel for a taping electronic component package shown in FIG. 10A.

As shown in FIG. 7A, the friction-reducing portion may include at least one tilted surface relative to the axial direction on the side surface of the core. Also, as shown in FIG. 6A, the core with the disassembly surfaces being tilted relative to the axial direction is able to include a friction-reducing portion. As shown in FIG. 10A, FIG. 11, and FIG. 13 below, the friction-reducing portion may include at least one protruding portion on the side surface of the core.

Second Preferred Embodiment

The separating portion of a reel for a taping electronic component package according to a second preferred embodiment of the present invention is located at a boundary between the core and one of the flanges and stripping the flange off a corresponding end of the core provides separation of the flanges.

Figure 8A:
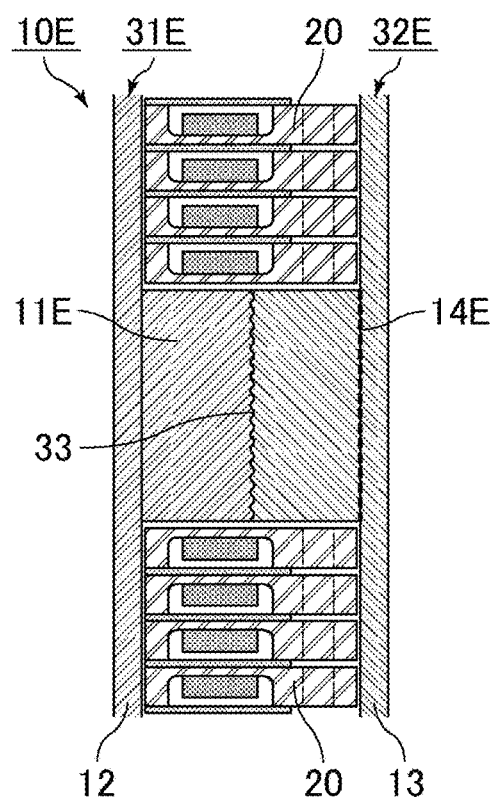
FIGS. 8A and 8B are each an enlarged cross-sectional view of an example of a reel for a taping electronic component package according to a second preferred embodiment of the present invention.
Figure 8B:
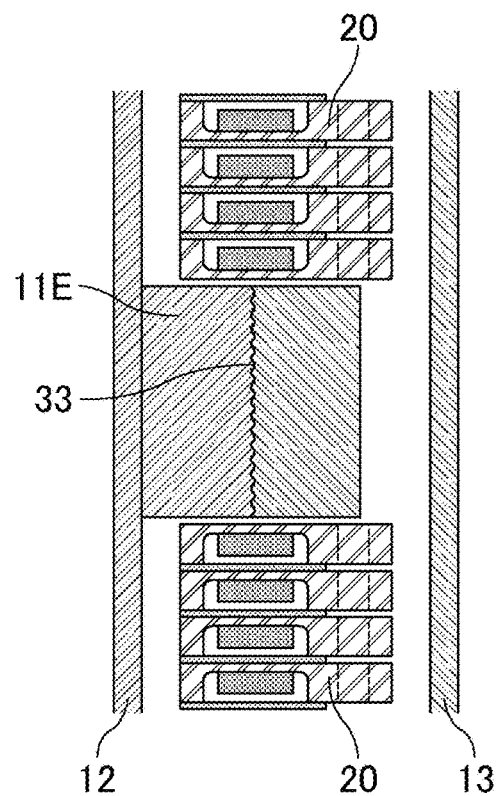

FIGS. 8A and 8B are each an enlarged cross-sectional view of an example of the reel for a taping electronic component package according to the second preferred embodiment of the present invention.

A reel 10E for a taping electronic component package shown in FIG. 8A includes a separating portion 14E at the boundary between a core 11E and the second flange 13. The separating portion 14E may be defined by perforations, for example. As shown in FIG. 8B, stripping the second flange 13 off the corresponding end of the core 11E provides separation of the first flange 12 and the second flange 13.

As shown in FIG. 8A, the reel 10E for a taping electronic component package is preferably defined by a joint between a first reel half 31E including the first flange 12 and a second reel half 32E including the second flange 13, for example. Accordingly, the separating portion 14E is located at a position different from the joint surface 33 between the first reel half 31E and the second reel half 32E.

Figure 9A:
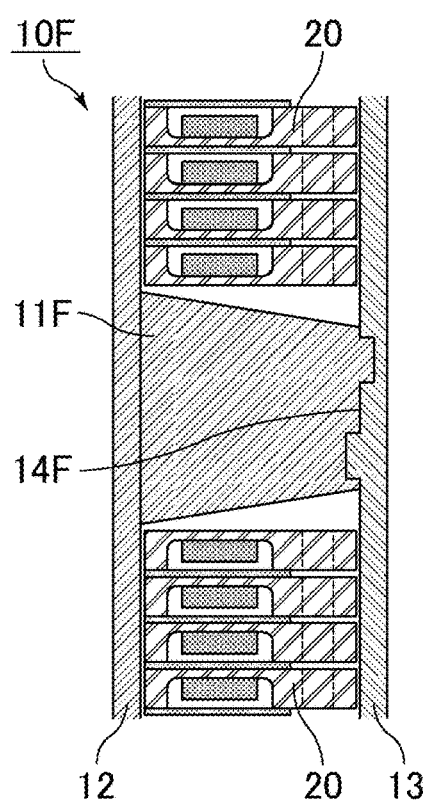
FIGS. 9A and 9B are each an enlarged cross-sectional view of another example of a reel for a taping electronic component package according to the second preferred embodiment of the present invention.
Figure 9B:
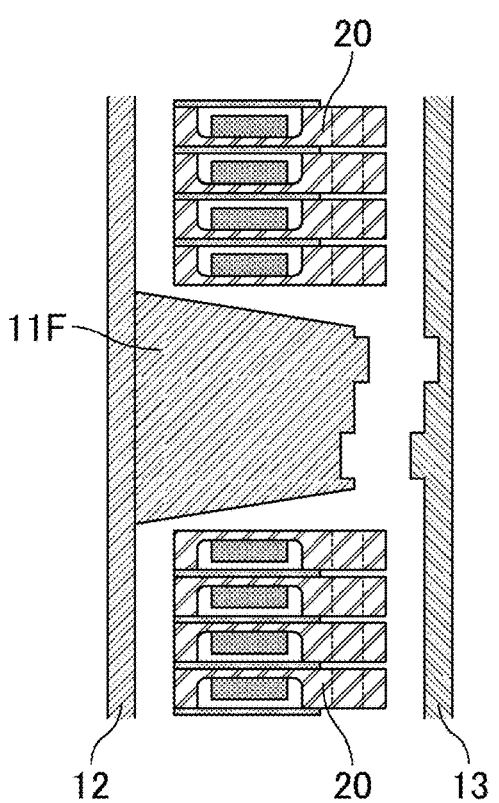

FIGS. 9A and 9B are each an enlarged cross-sectional view of another example of the reel for a taping electronic component package according to the second preferred embodiment of the present invention.

The reel 10F for a taping electronic component package shown in FIG. 9A includes a separating portion 14F at the boundary between a core 11F and the second flange 13. The separating portion 14F is defined by a snap-fit. As shown in FIG. 9B, stripping the second flange 13 off the corresponding end of the core 11F provides separation of the first flange 12 and the second flange 13.

As shown in FIG. 8A and FIG. 9A, the separating portion of the reel for a taping electronic component package according to the second preferred embodiment of the present invention may be defined by either perforations or a snap-fit. The snap-fit by combination of protrusions and recesses as shown in FIG. 9A may be fixed according to local fitting of the protrusions and recesses by ultrasonic welding.

Figure 10B:
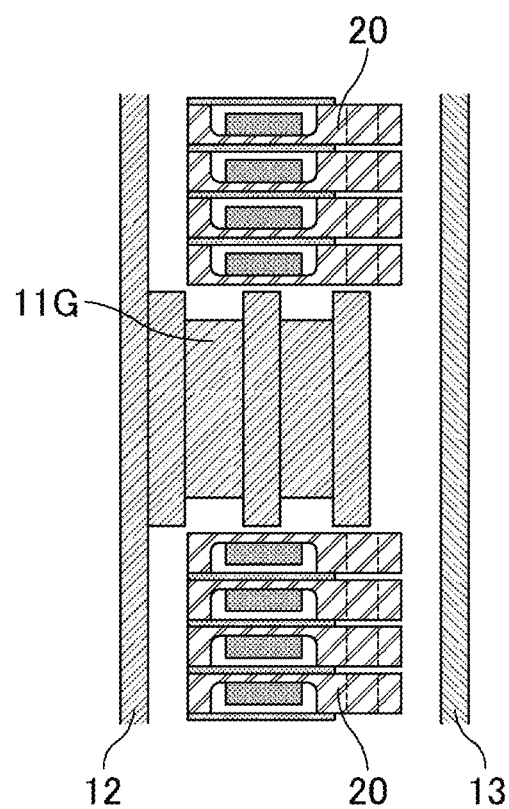

FIGS. 10A and 10B are each an enlarged cross-sectional view of another example of the reel for a taping electronic component package according to the second preferred embodiment of the present invention.

A reel 10G for a taping electronic component package shown in FIG. 10A includes a separating portion 14G at the boundary between a core 11G and the second flange 13. The separating portion 14G may be defined by perforations, for example. As shown in FIG. 10B, stripping the second flange 13 off the corresponding end of the core 11G provides separation of the first flange 12 and the second flange 13.

The side surface of the core 11G is provided with a stepped portion as a protruding portion along the axial direction or substantially along the axial direction. Accordingly, a smaller contact area with the taping electronic component package 20 is provided, and thus a reduced friction between the core 11G and the taping electronic component package 20 is provided. Accordingly, the reel 10G for a taping electronic component package is able to be easily extracted from the taping electronic component package 20.

This protruding portion has a wall shape, and the wall-shaped protruding portion may be along the axial direction or substantially along the axial direction or may be along the direction perpendicular or substantially perpendicular to the axial direction.

Figure 12:
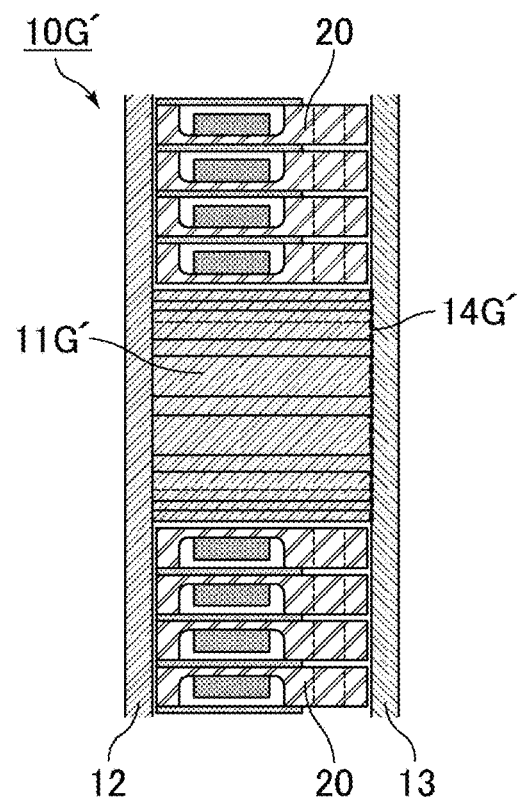
FIG. 12 is an enlarged cross-sectional view of the reel for a taping electronic component package shown in FIG. 11.

FIG. 11 is a front view of a modified example of the reel for a taping electronic component package shown in FIG. 10A. FIG. 12 is an enlarged cross-sectional view of the reel for a taping electronic component package shown in FIG. 11.

A reel 10G' for a taping electronic component package shown in FIG. 11 and FIG. 12 includes a separating portion 14G' at the boundary between a core 11G' and the second flange 13. The side surface of the core 11G' is provided with a stepped portion as a protruding portion along the circumferential direction perpendicular or substantially perpendicular to the axial direction.

FIG. 13 is an enlarged cross-sectional view of another modified example of the reel for a taping electronic component package shown in FIG. 10A.

A reel 10G" for a taping electronic component package shown in FIG. 13 includes a separating portion 14G" at the boundary between a core 11G" and the second flange 13. The side surface of the core 11G" is provided with a cross-cut uneven pattern as a protruding portion.

Figure 14A:
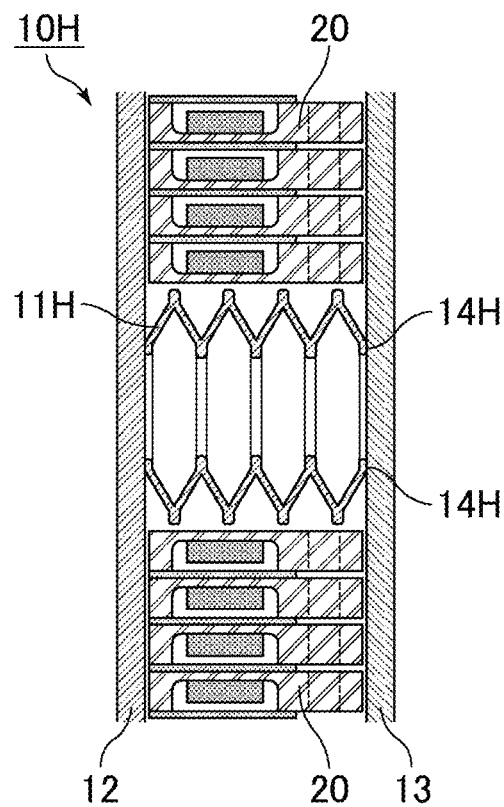
FIGS. 14A and 14B are each an enlarged cross-sectional view of another example of a reel for a taping electronic component package according to the second preferred embodiment of the present invention.
Figure 14B:
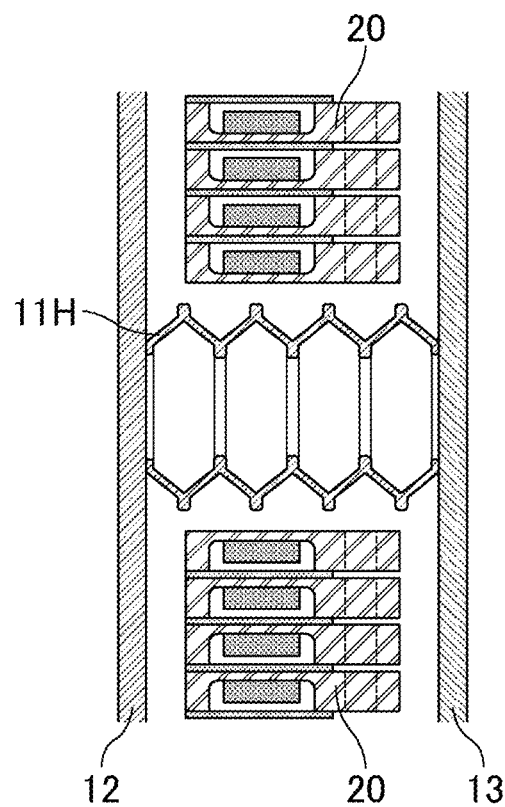

FIGS. 14A and 14B are each an enlarged cross-sectional view of another example of the reel for a taping electronic component package according to the second preferred embodiment of the present invention.

A reel 10H for a taping electronic component package shown in FIG. 14A includes a separating portion 14H at the boundary between a core 11H and the second flange 13. The separating portion 14H may be defined by perforations, for example. As shown in FIG. 14B, stripping the second flange 13 off the corresponding end of the core 11H provides separation of the first flange 12 and the second flange 13.

The side surface of the core 11H is provided with a bellows structure along the axial direction or substantially along the axial direction. Stretching the core 11H in the axial direction or substantially in the axial direction provides the core 11H with a reduced axial diameter. Accordingly, a smaller contact area with the taping electronic component package 20 is provided, and thus a reduced friction between the core 11H and the taping electronic component package 20 is provided. Accordingly, the reel 10H for a taping electronic component package is able to be easily extracted from the taping electronic component package 20.

Figure 15:
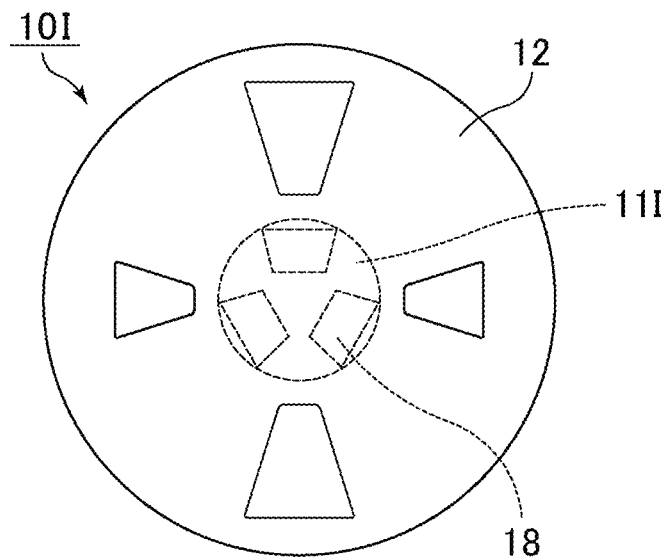
FIG. 15 is a front view of another example of a reel for a taping electronic component package according to the second preferred embodiment of the present invention.
Figure 16A:
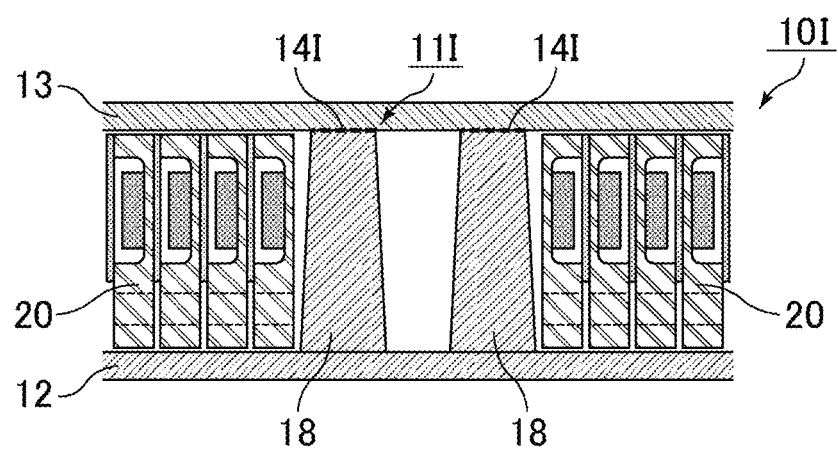
FIGS. 16A to 16C are each an enlarged cross-sectional view of the reel for a taping electronic component package shown in FIG. 15.
Figure 16B:
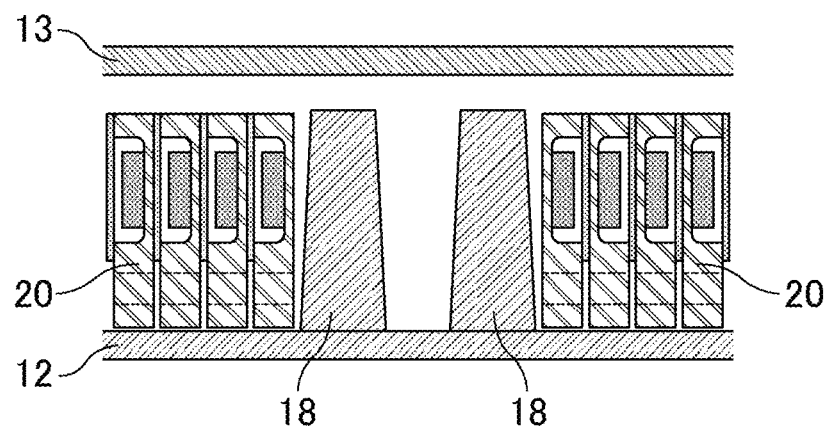
Figure 16C:
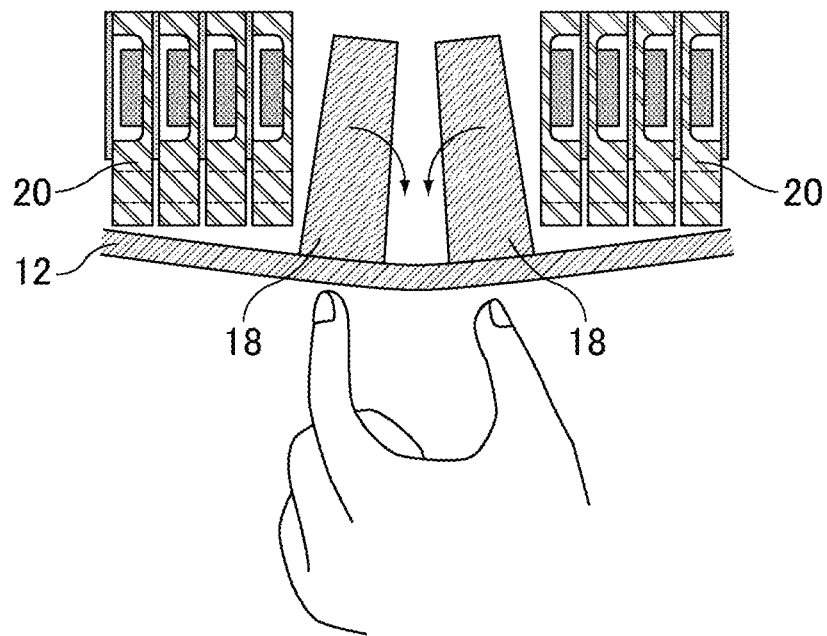

FIG. 15 is a front view of another example of the reel for a taping electronic component package according to the second preferred embodiment of the present invention. FIGS. 16A to 16C are each an enlarged cross-sectional view of the reel for a taping electronic component package shown in FIG. 15.

A reel 10I for a taping electronic component package shown in FIG. 15 and FIG. 16A includes a separating portion 14I at the boundary between a core 11I and the second flange 13. The separating portion 14I may be defined by perforations, for example. As shown in FIG. 16B, stripping the second flange 13 off the corresponding end of the core 11I provides separation of the first flange 12 and the second flange 13.

The reel 10I for a taping electronic component package includes multiple structures 18 supporting the core 11I. As shown in FIG. 16C, inclining the structures 18 toward a central axis reduces an axial diameter of the core 11I. Accordingly, a smaller contact area with the taping electronic component package 20 is provided, and thus a reduced friction between the core 11I and the taping electronic component package 20 is provided. Accordingly, the reel 10I for a taping electronic component package is able to be easily extracted from the taping electronic component package 20.

The reel 10G, 10G', 10G", or 10I for a taping electronic component package may be defined by a joint between the first reel half including the first flange 12 and the second reel half including the second flange 13. Accordingly, the separating portion 14G, 14G', 14G", or 14I is located at a position different from the joint surface between the first reel half and the second reel half.

The core of the reel for a taping electronic component package according to the second preferred embodiment of the present invention preferably includes a friction-reducing portion that reduces friction with the taping electronic component package, for example. Accordingly, the reel for a taping electronic component package is able to be easily extracted from the taping electronic component package.

As shown in FIG. 10A, FIG. 11, and FIG. 13, the friction-reducing portion may include at least one protruding portion on the side surface of the core. As shown in FIG. 7A, the friction-reducing portion may include at least one tilted surface relative to the axial direction on the side surface of the core. As shown in FIG. 14A, the friction-reducing portion may include a bellows structure along the axial direction or substantially along the axial direction on the side surface of the core. As shown in FIG. 15, the friction-reducing portion may include multiple structures supporting the core that are to be inclined toward the central axis. The friction-reducing effect is also able to be provided by coating the core with a coating agent, for example, fluororesin, that is able to increase the smoothness.

Third Preferred Embodiment

The separating portion of a reel for a taping electronic component package according to a third preferred embodiment of the present invention is located on each of the flanges and extracting the core together with portions at each of which the flange is in contact with a corresponding end of the core in the axial direction or substantially in the axial direction provides separation of the flanges.

Figure 17:
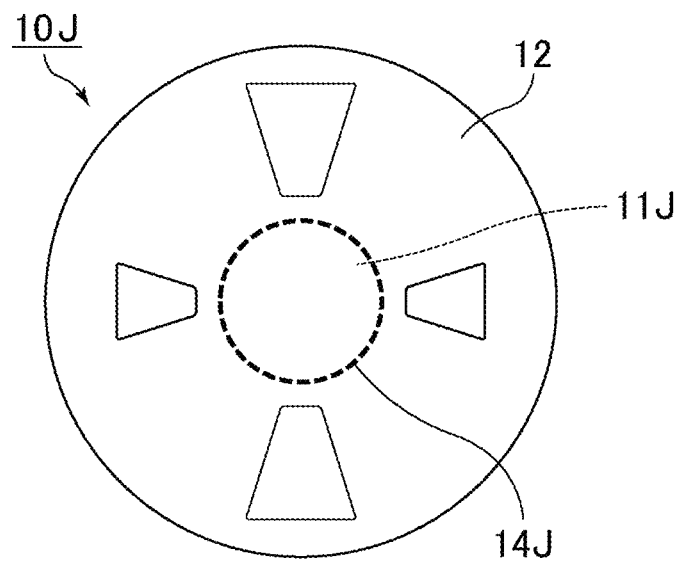
FIG. 17 is a front view of an example of a reel for a taping electronic component package according to a third preferred embodiment of the present invention.
Figure 18A:
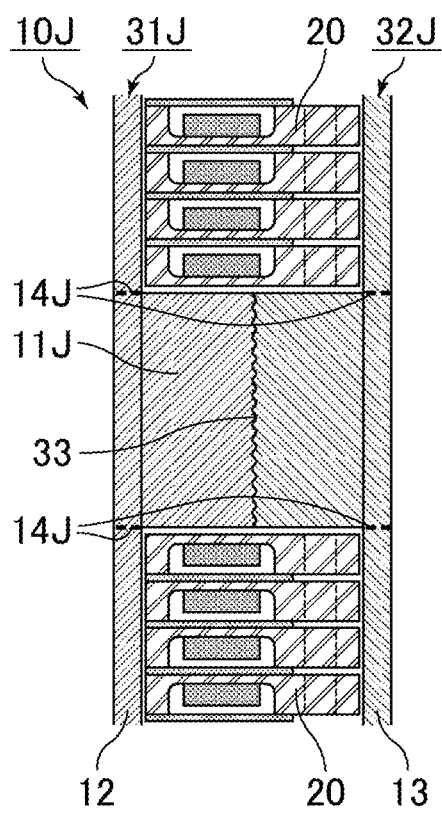
FIGS. 18A and 18B are each an enlarged cross-sectional view of the reel for a taping electronic component package shown in FIG. 17.
Figure 18B:
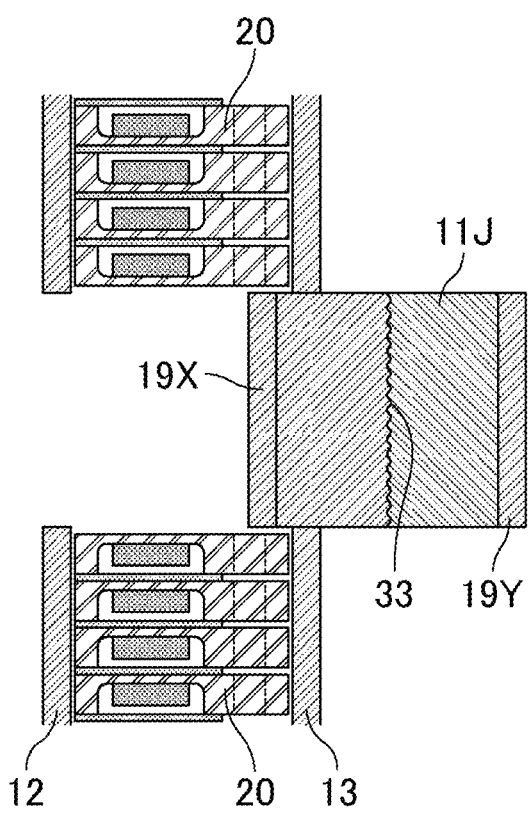

FIG. 17 is a front view of an example of the reel for a taping electronic component package according to the third preferred embodiment of the present invention. FIGS. 18A and 18B are each an enlarged cross-sectional view of the reel for a taping electronic component package shown in FIG. 17.

A reel 10J for a taping electronic component package shown in FIG. 17 and FIG. 18A includes a separating portion 14J on each of the first flange 12 and the second flange 13. Each separating portion 14J may be defined by perforations, for example. As shown in FIG. 18B, extracting the core 11J together with a portion 19X at which the first flange 12 is in contact with the corresponding end of the core 11J and a portion 19Y at which the second flange 13 is in contact with the corresponding end of the core 11J in the axial direction or substantially in the axial direction provides separation of the first flange 12 and the second flange 13.

As shown in FIG. 18A, the reel 10J for a taping electronic component package is preferably defined by a joint between a first reel half 31J including the first flange 12 and a second reel half 32J including the second flange 13, for example. Accordingly, each separating portion 14J is located at a position different from the joint surface 33 between the first reel half 31J and the second reel half 32J.

As shown in FIG. 17 and FIG. 18A, the separating portion of the reel for a taping electronic component package according to the third preferred embodiment of the present invention is preferably defined by perforations, for example.

The core of the reel for a taping electronic component package according to the third preferred embodiment of the present invention preferably includes a friction-reducing portion that has been described in the first preferred embodiment and the second preferred embodiment, for example. Accordingly, the reel for a taping electronic component package is able to be easily extracted from the taping electronic component package.

While preferred embodiments of the reel for a taping electronic component package of the present invention have been described above, various modifications and changes may be implemented without departing from the scope and spirit of the present invention, for example, in terms of structure and production conditions of the reel for a taping electronic component package.

The reel for a taping electronic component package of the present invention preferably has a distance between the outer surface of the first flange and the outer surface of the second flange of not smaller than about 7.95 mm and not greater than about 62.4 mm in accordance with JIS C0806-3, for example.

The first flange and the second flange of the reel for a taping electronic component package of the present invention each preferably have a thickness of not smaller than about 0.3 mm and not greater than about 3.0 mm, for example. The thickness of the first flange may be the same as or different from the thickness of the second flange. For example, in the second preferred embodiment of the present invention, the flange to be stripped may be thinner than the other flange.

The first flange and the second flange of the reel for a taping electronic component package of the present invention each preferably have a diameter of not smaller than about 95 mm and not greater than about 400 mm, for example.

The core of the reel for a taping electronic component package of the present invention preferably has a diameter of not smaller than about 45 mm and not greater than about 150 mm, for example.

A taping electronic component package to be wound around the reel for a taping electronic component package of the present invention preferably has a width of not smaller than about 3.9 mm and not greater than about 57 mm, for example.

In the case where the first reel half and the second reel half are joined to each other in the reel for a taping electronic component package of the present invention, one selected from the first reel half and the second reel half may not include the core.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A reel for a taping electronic component package that includes a tape including multiple recesses and electronic components housed in the respective recesses, the reel comprising:
   a core around which the taping electronic component package is able to be wound;
   a pair of flanges at respective ends of the core and facing each other across the core in an axial direction; and
   a separating portion providing a connection between the pair of flanges at the core; wherein
   the separating portion provides irreversible separation of the flanges such that after separation of the flanges, the flanges cannot be reconnected to each other without physical alteration to the core.

2. The reel according to claim 1, wherein
   the separating portion is located inside the core; and
   disassembling the core in the axial direction or substantially in the axial direction provides separation of the flanges.

3. The reel according to claim 2, wherein the core is able to be disassembled with disassembly surfaces being tilted relative to the axial direction.

4. The reel according to claim 2, wherein the separating portion is defined by a snap-fit.

5. The reel according to claim 1, wherein
the separating portion is located at a boundary between the core and one of the pair of flanges; and
stripping one of the flanges off a corresponding end of the core provides separation of the flanges.

6. The reel according to claim 1, wherein
the separating portion is located on each of the flanges; and
extracting the core together with portions at each of which the pair of flanges are in contact with a corresponding end of the core in the axial direction or substantially in the axial direction provides separation of the flanges.

7. The reel according to claim 1, wherein the core includes a friction-reducing portion that reduces friction with the taping electronic component package.

8. The reel according to claim 7, wherein the friction-reducing portion includes at least one tilted surface relative to the axial direction on a side surface of the core.

9. The reel according to claim 7, wherein the friction-reducing portion includes at least one protruding portion on a side surface of the core.

10. The reel according to claim 7, wherein
the friction-reducing portion includes a bellows structure along the axial direction or substantially along the axial direction on a side surface of the core; and
stretching the core in the axial direction or substantially in the axial direction reduces an axial diameter of the core.

11. The reel according to claim 7, wherein
the friction-reducing portion includes a plurality of structures supporting the core; and
inclining the plurality of structures toward a central axis reduces an axial diameter of the core.

12. The reel according to claim 1, wherein
the reel is defined by a joint between a first reel half including a first one of the pair of flanges and a second reel half including a second one of the pair of flanges; and
the separating portion is located at a position different from a joint surface between the first reel half and the second reel half.

13. The reel according to claim 12, wherein the separating portion is defined by perforations.

14. The reel according to claim 1, wherein at least one of the pair of flanges is joined to a corresponding end of the core or provided monolithically with the core.

15. The reel according to claim 1, wherein the core has a cylindrical or substantially cylindrical outer shape.

16. The reel according to claim 1, wherein each of the pair of flanges has an outer shape that is larger than an outer shape of the core.

17. The reel according to claim 1, wherein each of the flanges includes a resin material.

18. The reel according to claim 1, wherein the pair of flanges have different thicknesses from one another.

19. The reel according to claim 1, wherein a distance between outer surfaces of the pair of flanges is between about 7.95 mm and about 62.4 mm.

\* \* \* \* \*